United States Patent
Drake et al.

(10) Patent No.: US 7,321,269 B2
(45) Date of Patent: Jan. 22, 2008

(54) HIGH FREQUENCY RING OSCILLATOR WITH FEED-FORWARD PATHS

(75) Inventors: Alan J. Drake, Round Rock, TX (US); Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 11/184,352

(22) Filed: Jul. 19, 2005

(65) Prior Publication Data
US 2007/0018737 A1 Jan. 25, 2007

(51) Int. Cl.
*H03K 3/03* (2006.01)
*H03B 27/00* (2006.01)

(52) U.S. Cl. .......................... 331/57; 331/45; 331/183

(58) Field of Classification Search .................. 331/45, 331/57, 183
See application file for complete search history.

(56) References Cited

U.S. PATENT DOCUMENTS

| | | | |
|---|---|---|---|
| 6,353,369 B1 | 3/2002 | Boerstler et al. | 331/57 |
| 6,466,098 B2 * | 10/2002 | Pickering | 331/57 |
| 6,529,084 B1 | 3/2003 | Boerstler et al. | 331/57 |
| 6,559,727 B2 | 5/2003 | Boerstler et al. | 331/57 |
| 6,621,358 B2 * | 9/2003 | Carballo et al. | 331/57 |
| 6,744,326 B2 | 6/2004 | Boerstler et al. | 331/57 |
| 6,809,602 B2 | 10/2004 | Boerstler et al. | 331/57 |

* cited by examiner

*Primary Examiner*—Robert Pascal
*Assistant Examiner*—James Goodley
(74) *Attorney, Agent, or Firm*—Winstead PC (57) ABSTRACT

An inverting circuit comprises a first inverter in a main path having a first input and a common ouput. A second inverter receives the first input and is coupled with a first voltage controlled pass gate to the common output. A third inverter couples a second input to the common output using a second voltage controlled pass gate. A fourth inverter couples the second input to the common output using the first voltage controlled pass gate. A ring oscillator is formed using a number N of the inverting circuits with each common output coupled to the first inputs forming a main ring of a ring oscillator. The second inputs are coupled to feed-forward signals from selected outputs. The resulting signals at the common outputs are an interpolation of the first and second input signals modulated by a control voltage coupled to the first and second pass gates.

12 Claims, 10 Drawing Sheets

HIGH FREQUENCY RING OSCILLATOR WITH FEED-FORWARD PATHS

TECHNICAL FIELD

The present invention relates in general to complementary metal oxide semiconductor (CMOS) circuits for implementing a very high frequency voltage controlled oscillator (VCO).

BACKGROUND INFORMATION

Phase-locked loops (PLLs) have been widely used in high-speed communication systems because PLLs efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL, this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower reference frequency from a stable oscillator to generate system clock frequencies. A PLL also allows changing the system clock frequency without changing the reference frequency. The prior art has described ways of selecting operating points of voltage and frequency statically, for example, stopping execution while allowing the PLL to frequency lock to a new frequency. This slows system operations and complicates system design.

One of the key circuits in a PLL is a voltage-controlled oscillator (VCO). Circuits in the PLL generate an error voltage that is coupled to the VCO to control the frequency of the VCO output. By frequency dividing the output of the PLL and feeding it back and comparing it to a low frequency crystal-controlled reference clock, a stable high frequency clock may be generated. The VCO in a PLL typically has a range over which the frequency of the VCO may be voltage-controlled. In systems employing frequency scaling, it is desirable to have a voltage-controlled frequency range for normal voltage operation and another voltage-controlled frequency range for low voltage operation without resorting to two VCOs.

The VCO circuit is sometimes considered the most difficult circuit to implement in the PLL especially if ultra high frequencies and low jitter are required. Typically, the VCO is made using five or more inverting elements in a ring oscillator configuration. Standard ring oscillator topologies are relatively simple to design, have low-power, and have robust noise margins. The main drawback to the ring oscillator is that many stages are required to generate high quality signals and many stages lead to lower frequencies.

Figure 1A:
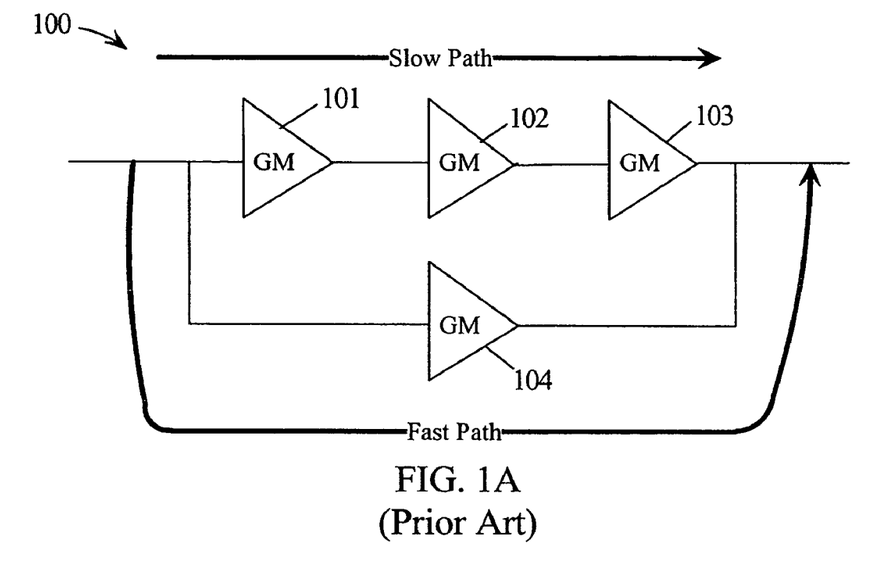
FIG. 1A is a circuit diagram of a slow path and a parallel fast path used in prior art ring oscillators.
Figure 1B:
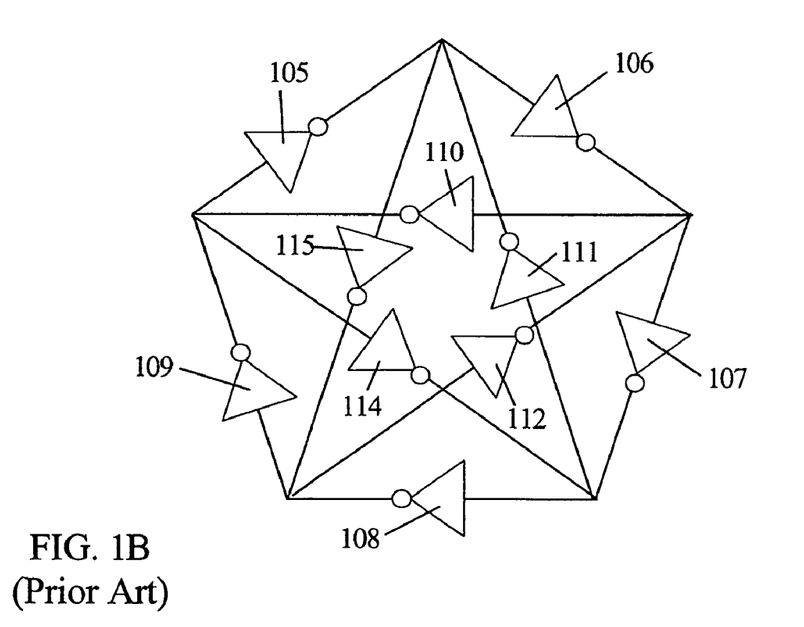
FIG. 1B is a circuit diagram of a 5-stage inverter ring oscillator wherein each group of 3 inverters are bypassed with a single fast path inverter.

The requirements for high frequency VCOs are becoming more demanding and in some cases the shortest ring oscillator of three stages may not produce sufficiently high frequencies. A number of circuit topologies have been developed to improve the frequencies possible with the ring oscillator. One such circuit topology is the "classic interpolator" as seen in FIG. 1A and FIG. 1B. Another circuit topology is the "phased oscillator" design shown in FIG. 2A and FIG. 2B. Both of these circuit topologies provide a frequency boost to the standard ring oscillator but both are limited to five or more oscillator stages. In most cases, these oscillator circuit topologies produce frequencies in the range of a standard three stage ring oscillator.

When high frequency VCOs are configured using inverting stages in a ring topology, it is important to know what are the best and worst case ranges that are achievable give process variations. In many cases, the guaranteed usable range is too narrow for a wide range of applications. This limits the application of the VCO and may require a selection process at the chip level to determine if a particular chip VCO has a realizable desired frequency range.

Therefore, there is a need for a way of configuring a ring VCO with a wide band useable frequency range when considering worst and best case process variations.

SUMMARY OF THE INVENTION

A voltage controlled ring oscillator is configure using inverting stages with voltage controlled pass gates coupling a parallel stage to each output of the main ring and a voltage controlled pass gate coupling feed-forward stages to each output of main ring. When the voltage controlled coupling is turned OFF, the basic ring oscillator operates at its lowest frequency where each inverting stage in the main ring is loaded with the highest capacitance of inactive stages. As the voltage controlled coupling is turned progressively ON, the inverting stages in the main ring are paralleled with inverting stages that increase the drive at each output from the main ring and from a feed-forward signal thereby increasing the oscillating frequency. The capacitance decreases the low frequency range while leaving the high frequency range unaffected thus allowing a wider guaranteed band of worst/best case operation.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1A illustrates an inverting stage 100 comprising a fast path with inverter 104 and a slow path with inverters 101-103. Typically, the fast path inverter 104 has some form of voltage control to set its delay. In this manner, the combined delay through the parallel path may be modulated. A logic transition on the output is the combined response of inverter 103 and 104.

FIG. 1B is a circuit diagram of a 5-stage inverter ring oscillator using the parallel fast paths and slow paths of FIG. 1A. Each group of 3 inverters in the outer ring is bypassed by a single inverter in the inner path. Inverters 105-107 are bypassed with inverter 114, inverters 106-108 are bypassed by inverter 115, inverters 107-109 are bypassed by inverter 110, inverters 108-109 and 105 are bypassed by inverter 111, and inverters 109 and 105-106 are bypassed with inverter 112.

Figure 2A:
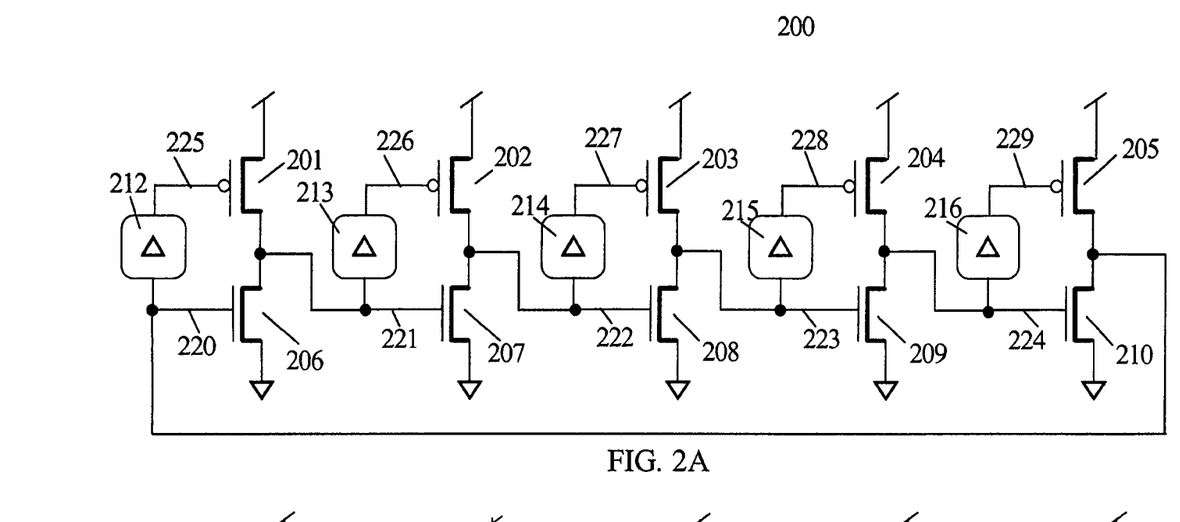
FIG. 2A is a circuit diagram of a phased feedback ring oscillator used in the prior art.

FIG. 2A is a circuit diagram of phased feedback 5-stage inverter ring oscillator used in the prior art. PFETS 201-205 and corresponding NFETS 206-210 form the inverting stages wherein the gate drive for the PFETS and the NFETS of the same stage are driven by different signals. Delay blocks 212-216 illustrate that the signals that turn the NFETS ON and turn the PFETS OFF a delay time later. Inputs 220-224 are delayed to produce inputs 225-229.

Figure 2B:
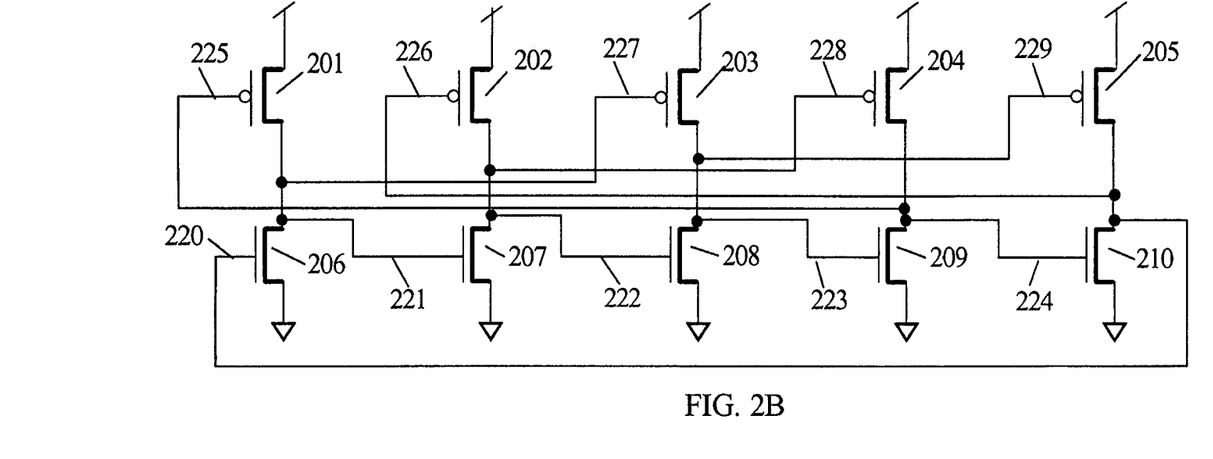
FIG. 2B is a circuit diagram illustrating how the phased feedback of FIG. 2A is implemented in a 5-stage inverter ring oscillator.

FIG. 2B illustrates connections that implement the topology of FIG. 2A. When an NFET turns ON, then a delayed signal is generated that turns OFF its series coupled PFET at a later time. A logic one transition on the node 220 of NFET 206 turns NFET 206 ON but does not turn PFET 201 OFF until a delay time later (as set by the delay of 212). Therefore, the gate 225 of PFET 201 must be at a logic zero, in which case both PFET 201 and NFET 206 are ON at the same time. These two devices will operate in an analog mode during this time period with the transition state on node 221 determined by the relative impedances of the ON devices PFET 201 and NFET 206. When node 221 eventually falls below the threshold voltage of NFET 207, then NFET 207 will turn OFF. In this case, PFET 202 is OFF and will turn ON a delay time later determined by delay block 213. For the delay period of delay block 213, both NFET 207 and PFET 202 are OFF. The alternate "analog" logic one and logic zero states propagate through outputs 222-224 and delay blocks 214-216. The assumed logic one transition of gate 220 propagates as a logic one transition on node 224 which turns ON NFET 210 and causes node 220 to transition to the opposite of the assumed state.

No matter what output state is assumed, traversing through the forward delay path will yield a logic state that changes the assumed state. This is true for P and N channel devices which in each stage are coupled to different gate control signals. This circuit topology will give good results; however, it does not have a phase synchronous complementary output and it is limited to 5 stages because each stage feeds back from 3 stages ahead which requires 4 stages and the overall circuit must be inverting so it requires 5 stages.

Figure 3A:
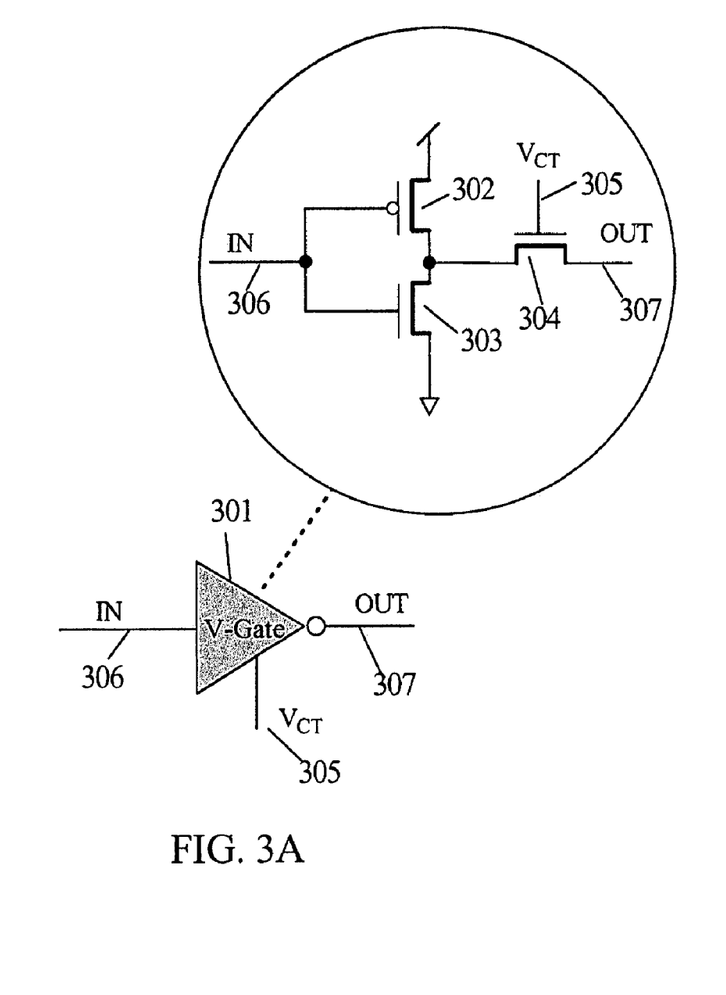
FIG. 3A is a circuit diagram of a basic inverter with its output coupled through a voltage controlled pass gate thus forming a V-gate.

FIG. 3A is a circuit diagram of an inverting stage 301 with input 306, output 307 and control voltage 305. Inverting stage 301 comprises a basic inverter, PFET 302 and NFET 303, with input 306 and an output coupled through a pass gate 304 controlled with voltage VCT 305 to generate output 307. The circuit of FIG. 3A is termed a V-gate 301.

Figure 3B:
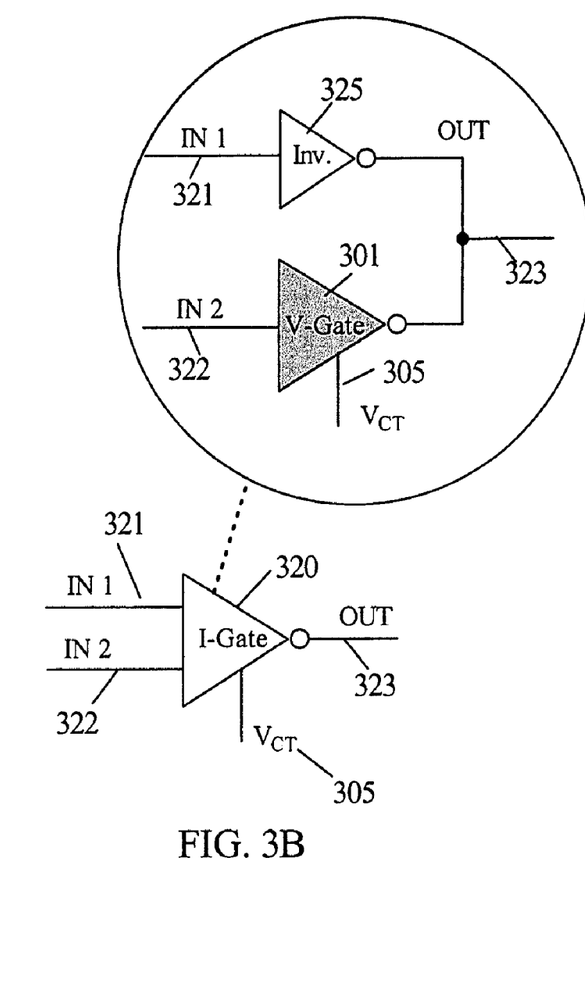
FIG. 3B is a circuit diagram of a standard inverter with a first input dot OR'ed with a V-gate with a second input forming an interpolating inverter (I-gate)

FIG. 3B is a circuit diagram of an inverting circuit 320 that has a first input 321, a second input 322, an output 323, and a control voltage 305. Inverting circuit 320 comprises a standard inverter 325 with input 321 and an output coupled to output 323. Standard inverter 325 is coupled in parallel with V-gate 301 with input 322 and an output coupled to output 323. The combination of inverter 325 and V-gate 320 is termed an interpolating gate (I-gate) as the time varying voltage level of output 323 is the interpolation result of inputs 321 and 322 modulated by control voltage VCT 305. The signal at output 323 depends of the timing of inputs 321 and 322 and the strength of the drive of inverter 325 and V-gate 301. The strength of the drive of V-gate 301 is determined by the size of the FETs forming V-gate 301 (e.g., PFET 302 and NFET 303) as well as the level of voltage VCT 305.

Figure 4A:
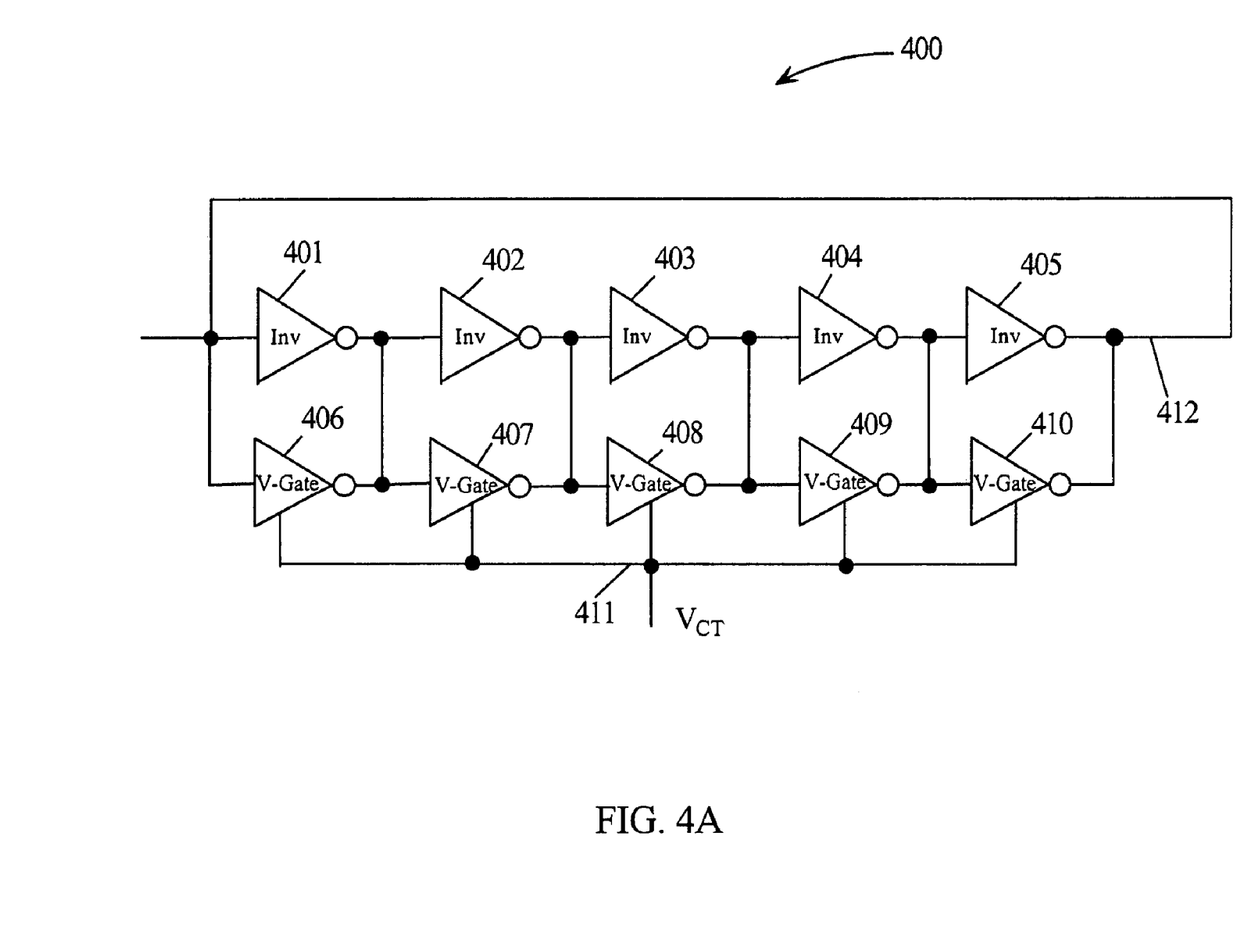
FIG. 4A is a circuit diagram illustrating a main ring of inverters with each stage paralleled with and inverting stage coupled with a voltage controlled pass gate.

FIG. 4A is a circuit diagram of a voltage controlled ring oscillator 400 configured with a series connection of inverters 401-405 in a main ring paralleled with V-gates 406-410 in a secondary ring. V-gates 406-410 are controlled with voltage VCT 411. Varying voltage VCT 411 determines the strength of coupling of the parallel secondary ring and thus the frequency of the signal at output 412 of VCO 400.

Figure 4B:
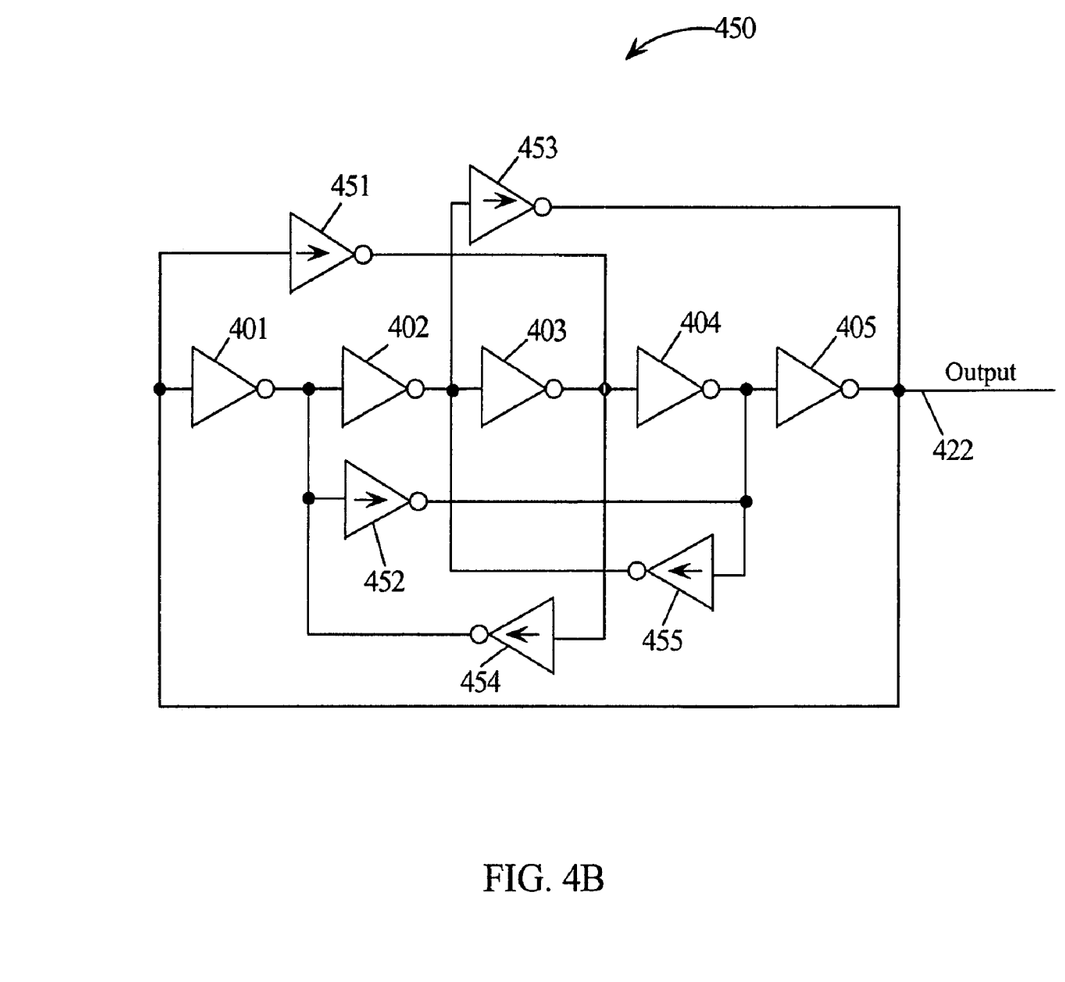
FIG. 4B is a circuit diagram of 5 stage ring with feed-forward inverters coupled around each group of three inverters in the main ring.

FIG. 4B is a circuit diagram of a ring oscillator 450 configured with a series connection of inverters 401-405 in the main ring and feed-forward inverters 451-455 coupled around each group of 3 inverters selected from inverters 401-405. Each output in the main ring has two outputs dot OR'ed together. The transition at each output is determined by the "interpolation" of the two output signals driving each output. The frequency of a signal at output 422 of ring oscillator 450 is increased by using the feed-forward inverters 451-455.

Figure 5:
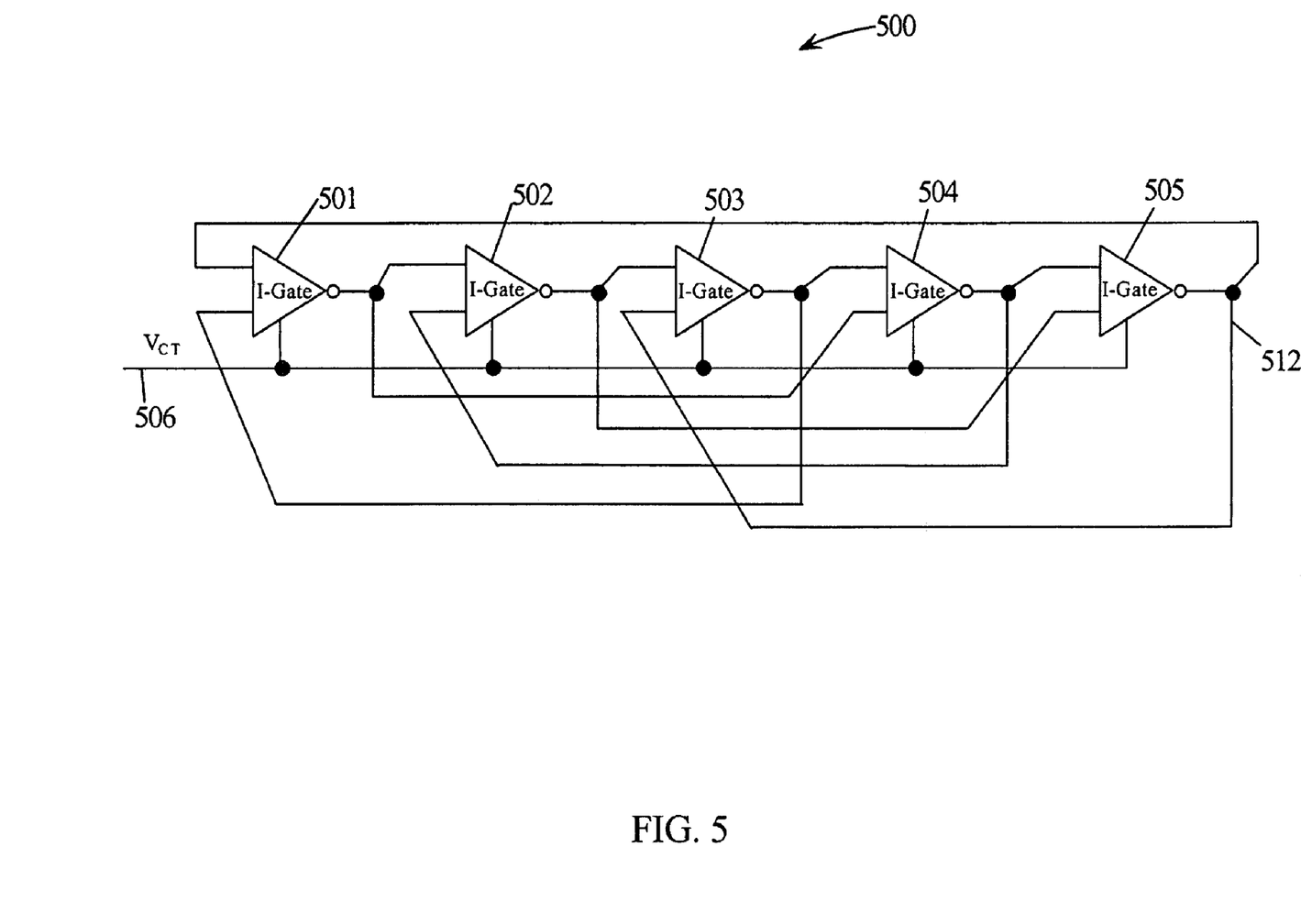
FIG. 5 is a circuit diagram of a ring oscillator formed with I-gates.

FIG. 5 is a circuit diagram block diagram of a voltage controlled ring oscillator 500 configured with I-gates 501-505. Each I-gate 501-505 is has a circuit topology like I-gate 320 in FIG. 3B. Using I-gates 501-505 allows the feed-forward output to drive isolated inputs. Voltage VCT 506 determines the strength of coupling of the V-gates (e.g., V-gate 301 in FIG. 3B) used to configure I-gates 501-505. The frequency of the oscillator signal at output 512 is controlled by control voltage VCT 506 coupled to each V-gate in I-gates 501-505.

Figure 6:
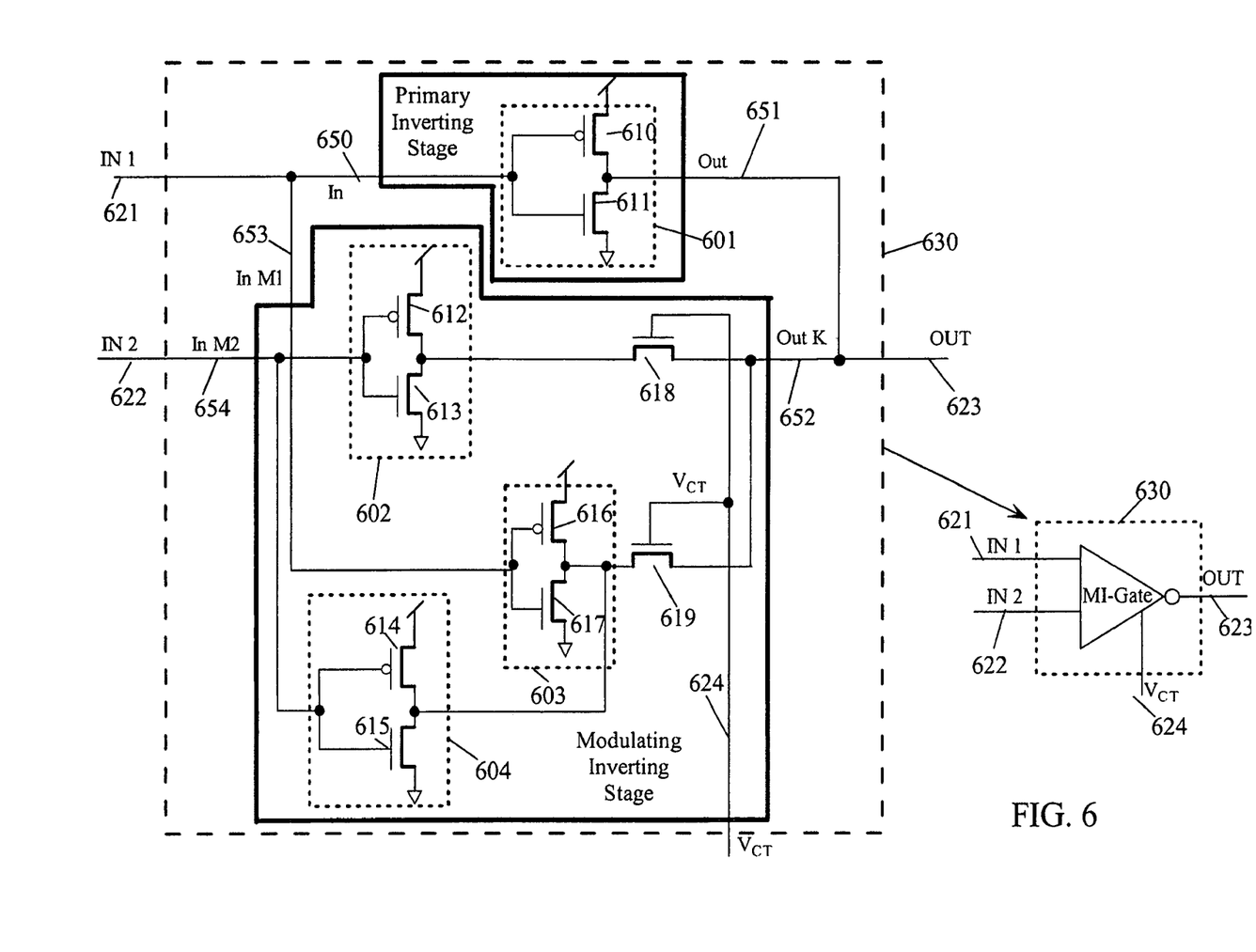
FIG. 6 is a circuit diagram of a modified I-gate (MI-G) according to embodiments of the present invention.

FIG. 6 is a circuit diagram of a modified I-gate (MI-G) 630 according to embodiments of the present invention. MI-G 630 has a primary inverting stage comprising inverter 601 in a main path with input 650 and output 651 and a modulating inverting stage comprising inverters 602-604 and pass gates 628-619. The modulating inverting stage has a first input In M1 653, a second input In M2 654 and an output Out K 652 this is coupled with Out 651 to form OUT 623 of MI-gate 630. Input IN 1 621 of MI-G 630 is formed by coupling Input 650 and In M1 653. Input IN 2 622 is coupled to In M2 654. All the circuitry of FIG. 6 is termed an MI-gate 630 for simplicity.

Input IN 1 621 is coupled to Input 650 of inverter 601 configured with PFET 610 and NFET 611 and the output of inverter 601 is coupled to OUT 623 of MI-G 630. Inverter 601 is in the main path (e.g., making up the main ring). Inverter 603 is configured with PFET 616 and NFET 617 and is coupled in parallel with inverter 601 with pass gate 619 which is controlled by voltage VCT 620. Inverter 603 forms the secondary path from IN 1 621 to OUT 623. A signal at IN 2 622 is coupled to OUT 623 by inverter 602 and pass gate 618. Inverter 602 is configured with PFET 612 and NFET 613. The signals at IN 1 621 and IN 2 622 "interpolate" to generate the output signal at OUT 623 depending on their timing and the strength of the coupling determined by voltage VCT 624. The signal at IN 2 622 is also coupled to OUT 623 via inverter 604 and pass gate 619. Inverter 604 is configured with PFET 614 and NFET 615. The strength of signal at IN 2 622 is further modulated by pass gate 619. Normally all the inverters 601-604 are the same size, however, they may have variable sizes and still be within the scope of the present invention. Pass gate 619 is normally twice as big as pass gate 618 since it has to conduct the current of both inverters 603 and 604. When pass gates 618 and 619 are both turned OFF, only the signal from inverter 601 is used to drive OUT 623. In this case, all the capacitance of the other devices load OUT 623, thus the response through inverter 601 is the slowest. As VCT turns ON pass gates 618 and 619 the drive from inverters 602-604 assist in driving the capacitance at output 623 and the response to output 623 is the faster. The signal at OUT 623 is the interpolation of the signals at IN 1 621 and IN 2 622 coupled through inverters 602-604 via pass gates 618 and 619. The large capacitance load on inverter 601, when the pass gates 618-619 are OFF, sets the low frequency response of MI-G 630 substantially independent of the high frequency response. The drive and the interpolation of inverters 602-604 via pass gates 618-619 sets the high frequency response of MI-G 630. When MI-G 630 is used to form a ring oscillator, a wider frequency range is realized under best/worst case process variations.

Figure 7A:
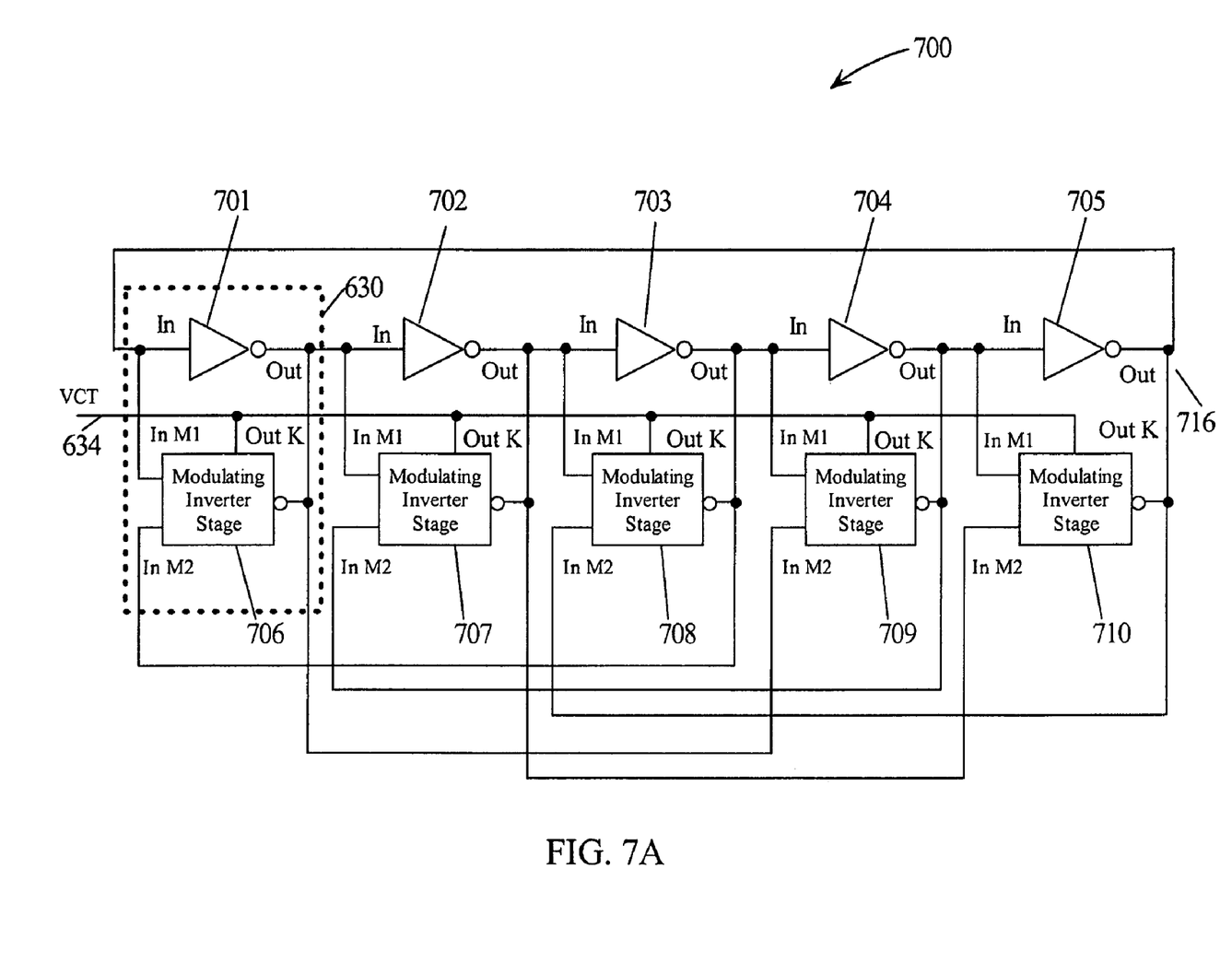
FIG. 7A is a circuit diagram of a voltage controlled ring oscillator according to embodiments of the present invention.

Referring to FIG. 7A and FIG. 6. FIG. 7A illustrates VCO 700 according to embodiments of the present invention. VCO 700 comprises five primary inverting stages (inverters 701-705) wherein the output of each primary inverter stage (Out) is coupled to the input (In) of a following inverting stage. Further, the output of the fifth primary inverting stage (inverter 705) is coupled back to the input (In) of inverter 701. VCO 700 further comprises 5 modulating inverting stages (706-710) each with a first input (In M1), a second input (In M2), and an output (Out K), wherein the first input (In M1) of a given numbered modulating inverting stage (e.g., the second stage 707) is coupled to an input of a same number (2) primary inverting stage (inverter 702) and the Out K of modulating inverting stage numbered (e.g., 2) is coupled to the output (Out) of the same number (2) primary inverting stage (inverter 702). Likewise, the second input (In M2) of the modulating inverting stage numbered (2) is coupled to an output (Out) of a primary inverting stage two stages ahead (e.g., numbered 2+2=4 (modulo 5)). Modulo 5 describes which stages are coupled when the two stage ahead number exceeds the number of the last stage (e.g., 4+2=1 (modulo 5)). The output (OUT 623) of each MI-G 630 in VCO 700 is the conjunction of an Out 651 and an Out K 652 as illustrated in FIG. 6. Thus, when the second input (In M2) of a modulating inverting stage numbered (2) (e.g., 707) in VCO 700 is coupled to an output Out K of the modulating inverting stage (e.g., 709) two stages ahead, it is also coupled to the corresponding output (Out) of the primary inverting stage (e.g., 704).

Figure 7B:
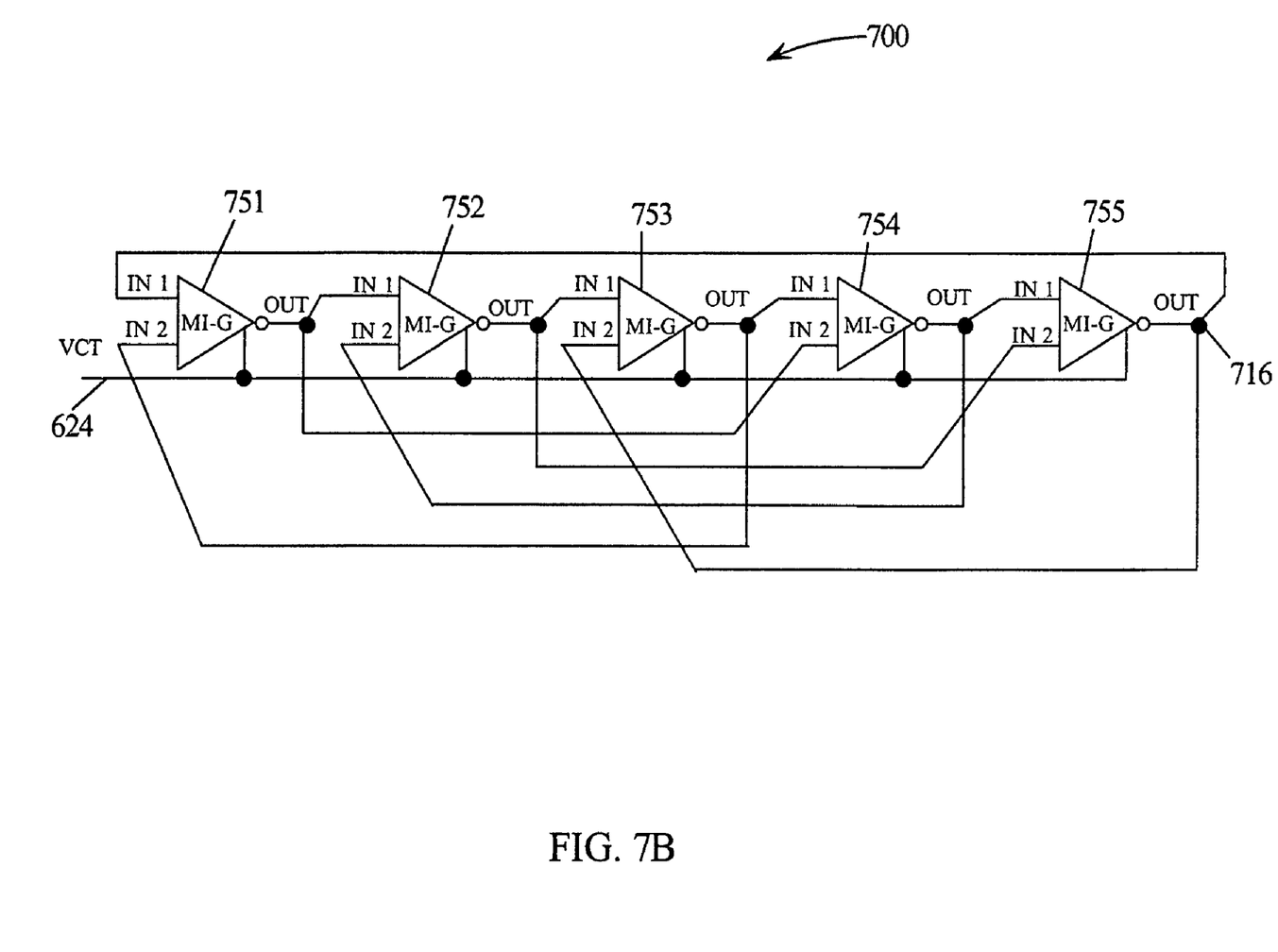
FIG. 7B is a circuit diagram of the voltage controlled ring oscillator in FIG. 7A using MI-gates according to embodiments of the present invention.

FIG. 7B is the voltage controlled ring oscillator 700 formed with MI-G 701-705 according to embodiments of the present invention. MI-G 701-705 are configured like MI-G 630 in FIG. 6. Since the low frequency response of the MI-G 701-705 is set independent of the high frequency response, VCO 700 has the widest realizable frequency range under best/worst case process variations. VCT 624 is used to varying the frequency of the signal at output 706 of VCO 700. FIG. 7B is a simplified schematic of VCO 700, shown in FIG. 7A, wherein the internal connections of MI-G 630 are not shown.

Figure 8:
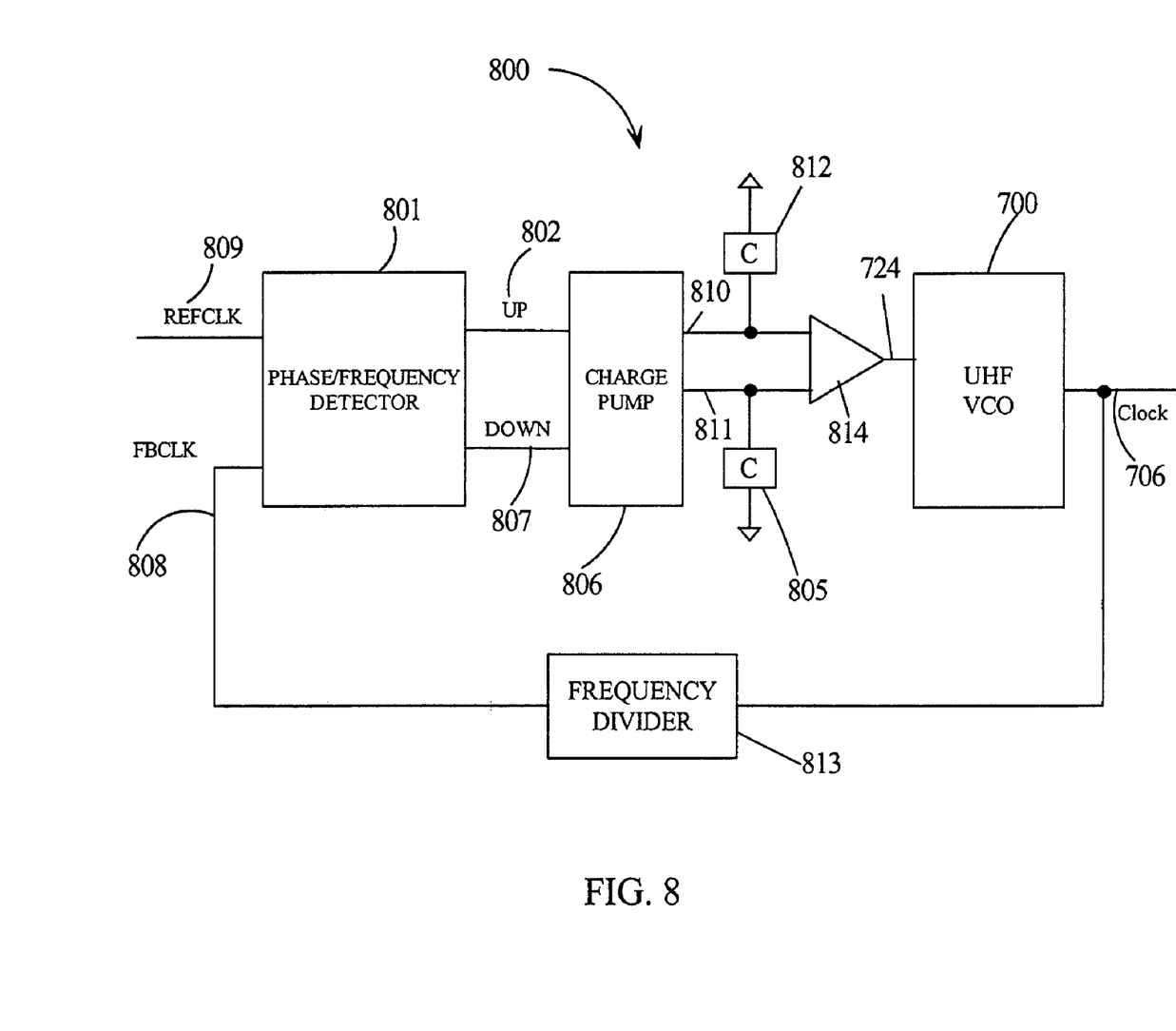
FIG. 8 is a block diagram of a phase lock loop suitable for use with a VCO configured with MI-gates according to embodiments of the present invention.

FIG. 8 is a block diagram of a representative phase lock loop circuit 800 suitable for practicing the principles of the present invention. Reference clock (RCLK) 809 and feedback clock (FBCLK) 808 are compared in phase/frequency detector (PFD) 801 generating UP signal 802 and DOWN signal 807 which are applied as control signals to charge pump 806. UP signal 802 and DOWN signal 807 are used to control current sources in charge pump 806. Charge pump 806 has charge pump nodes 810 and 811. Capacitor 812 is coupled between charge pump node 811 and ground and capacitor 805 is coupled between charge pump node 811 and ground. UP signal 802 and DOWN 807 are generated in response to a lead or lag phase difference between RCLK 809 and FBCLK 808. Since RCLK 809 and FBCLK 808 cannot concurrently have a lead and a lag phase error, UP signal 802 and DOWN 807 are mutually exclusive signals. Exemplary UHF VCO 700 (See FIG. 7) produces a clock signal 706 according to embodiments of the present invention. Clock signal 706 is frequency divided by frequency divider 813 generating FBCLK 808. UHF VCO 700 has voltage controlled frequency using the embodiment FIG. 7. The differential signal between charge pump nodes 810 and 811 is converted to an exemplary single ended control voltage 724 with amplifier 814 to control the frequency of UHF VCO 700 within a frequency range.

Although the method, system and computer program product are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A voltage controlled ring oscillator comprising:
   a number N primary inverting stages each having an input and an output, wherein the N primary inverting stages are coupled in series with the output of the Nth primary inverting stage coupled back to the input of the first primary inverting stage; and
   N modulating inverting stages each having a first input, a second input and an output, wherein the first input of modulating inverting stage numbered M is coupled to an input of a primary inverting stage numbered M from the N primary inverting stages, the output of modulating inverting stage numbered M is coupled to an output of the primary inverting stage numbered M from the N primary inverting stages, the second input of modulating inverting stage numbered M is coupled to an output of a primary inverting stage numbered (M+2)(modulo N) from the N primary inverting stages, and a signal level on the output of each of the N modulating inverting stages is varied in response to a voltage level of a common control voltage and corresponding voltage levels on the first and second inputs of each of the N modulating inverting stages, and
   wherein the modulating inverting stages each comprises:
   a first inverter having an input coupled to the first input of the modulating inverting stage and an output;
   a first pass gate having an input coupled to the output of the first inverter, a pass gate output coupled to the output of the modulating inverting stage, and a first control input coupled to the common control voltage;
   a second inverter having an input coupled to the second input of the modulating inverting stage and an output;
   a second pass gate having an input coupled to the output of the second inverter, a pass gate output coupled to the output of the modulating inverting stage, and a second control input coupled to the common control voltage; and
   a third inverter having an input coupled to the second input of the modulating inverting stage and output coupled to the output of the second inverter.

2. The voltage controlled ring oscillator of claim 1, wherein the first primary inverting stage and first modulating inverting stage each comprise:
   a PFET having a source coupled to a first power supply voltage potential a gate coupled as the input of the first inverting stage, and a drain; and
   an NFET having a drain coupled to the drain of the PFET, a gate coupled to the input of the first inverting stage and a source coupled to a second power supply voltage potential.

3. The voltage controlled ring oscillator of claim 1, wherein the first, second, and third inverters each have substantially the same output current drive capability.

4. The voltage controlled ring oscillator of claim 3, wherein the second pass gate is at least twice as large as the first pass gate and thereby has an ON state resistance that is at least one half an ON state resistance of the first pass gate.

5. The voltage controlled ring oscillator of claim 3, wherein the first, second, and third inverters each comprise;
a PFET having a source coupled to a first power supply voltage potential a gate coupled as the input, and a drain; and
an NFET having a drain coupled to the drain of the PFET, a gate coupled to the input and a source coupled to a second power supply voltage potential, wherein the PFET and the NFET are sized to have equivalent current drive levels.

6. The voltage controlled ring oscillator of claim 1, wherein the number N is an odd number greater than one.

7. A phase locked loop (PLL) circuit for generating a clock signal and a substantially non-skewed complementary clock signal of the same frequency that is a multiple number P times the frequency of a reference clock signal, comprising:
   a voltage controlled oscillator (VCO) generating the clock signal with a frequency modified in response to a control voltage;
   a frequency divider for frequency dividing the clock signal or the complementary clock signal by P, generating a frequency divided clock signal;
   a phase frequency detector for comparing the frequency divided clock signal to the reference clock signal and generating a phase/frequency error signal; and
   circuitry for converting the phase/frequency error signal to the control voltage, wherein the VCO has a number N primary inverting stages each having an input and an output, wherein the N primary inverting stages are coupled in series with the output of the Nth primary inverting stage coupled back to the input of the first primary inverting stage, the VCO further having N modulating inverting stages each having a first input, a second input and an output, wherein the first input of modulating inverting stage numbered M is coupled to an input of a primary inverting stage numbered M from the N primary inverting stages, the output of modulating inverting stage numbered M is coupled to an output of the primary inverting stage numbered M from the N primary inverting stages, the second input of modulating inverting stage numbered M is coupled to an output of a primary inverting stage numbered (M+2)(modulo N) from the N primary inverting stages, and a signal level on the output of each of the N modulating inverting stages is varied in response to a voltage level of a common control voltage and corresponding voltage levels on the first and second inputs of each of the N modulating inverting stages, and
   wherein the modulating inverting stages each comprise:
   a first inverter having an input coupled to the first input of the modulating inverting stage and an output;
   a first pass gate having an input coupled to the output of the first inverter, a pass gate output coupled to the output of the modulating inverting stage, and a first control input coupled to the common control voltage;
   a second inverter having an input coupled to the second input of the modulating inverting stage and an output;
   a second pass gate having an input coupled to the output of the second inverter, a pass gate output coupled to the output of the modulating inverting stage, and a second control input coupled to the common control voltage; and
   a third inverter having an input coupled to the second input of the modulating inverting stage and output coupled to the output of the second inverter.

8. The PLL circuit of claim 7, wherein the first primary inverting stage and first modulating inverting stage each comprise:

a PFET having a source coupled to a first power supply voltage potential a gate coupled as the input of the first inverting stage, and a drain; and an NFET having a drain coupled to the drain of the PFET, a gate coupled to the input of the first inverting stage and a source coupled to a second power supply voltage potential.

9. The PLL circuit of claim 7, wherein the first, second and third inverters have substantially a same output current drive capability.

10. The PLL circuit of claim 9, wherein the second pass gate is at least twice as large as the first pass gate and thereby has an ON state resistance that is at least one half an ON state resistance of the first pass gate.

11. The PLL circuit of claim 9, wherein the first, second and third inverters each comprise;

a PFET having a source coupled to a first power supply voltage potential a gate coupled as the input, and a drain; and an NFET having a drain coupled to the drain of the PFET, a gate coupled to the input and a source coupled to a second power supply voltage potential, wherein the PFET and the NFET are sized to have equivalent current drive levels.

12. The PLL circuit of claim 7, wherein the number N is an odd number greater than one.

* * * * *